United States Patent [19]

Anzai et al.

[11] Patent Number: 5,459,685
[45] Date of Patent: Oct. 17, 1995

[54] SEMICONDUCTOR MEMORY DEVICE HAVING MEMORY CELLS WITH ENHANCED CAPACITOR CAPACITY

[75] Inventors: Kenji Anzai; Toshio Wada, both of Tokyo, Japan

[73] Assignee: Nippon Steel Corporation, Tokyo, Japan

[21] Appl. No.: 218,947

[22] Filed: Mar. 29, 1994

[30] Foreign Application Priority Data

Apr. 2, 1993 [JP] Japan .................... 5-100301

[51] Int. Cl.⁶ .................... H01G 4/06; H01L 29/78
[52] U.S. Cl. .................... 365/149; 257/300; 257/306
[58] Field of Search .................... 365/149; 257/296, 257/297, 300, 306

[56] References Cited

U.S. PATENT DOCUMENTS 4,905,064   2/1990  Yabu ........................ 257/306
5,216,267   6/1993  Jin ........................... 257/306
5,305,256   4/1994  Tanigawa ................ 365/149

OTHER PUBLICATIONS

S. Sheffield Eaton et al., High–Speed DRAM Obtained By Abolition Of Boosting Voltage In Word Lines And Decrease Of Amplification Of Sense Amplifiers, pp. 84–88, Nikkei Microdevices, Jun. 1992.

*Primary Examiner*—David C. Nelms
*Assistant Examiner*—Son Mai
*Attorney, Agent, or Firm*—Pollock, Vande Sande & Priddy

[57] ABSTRACT

A semiconductor memory device includes a dielectric layer formed on a conductive thin film layer constituting a shield electrode for effecting element separation in a field area, the dielectric layer connected to a dielectric layer of a capacitor with a lower electrode having part thereof opposite to part of the shield electrode through the dielectric layer, and has an increase in electrode area of a memory cell to be able to attain the high level of integration.

3 Claims, 2 Drawing Sheets

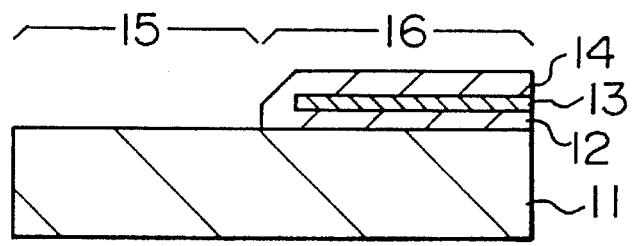
FIG. IA
PRIOR ART
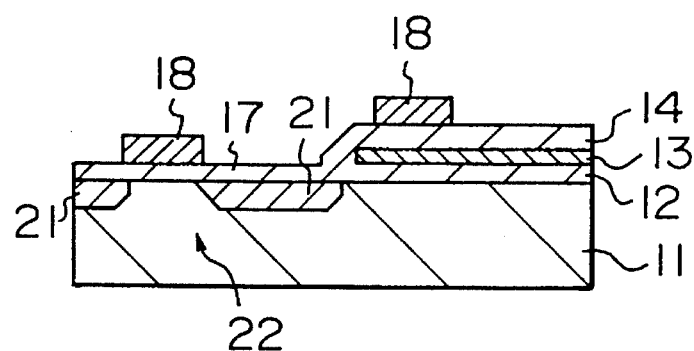
FIG. IB
PRIOR ART
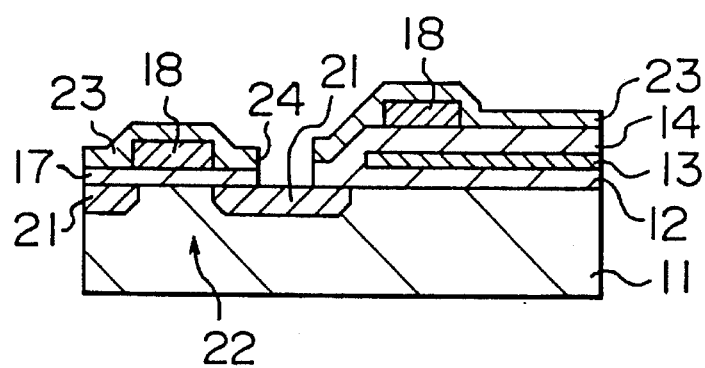
FIG. IC
PRIOR ART
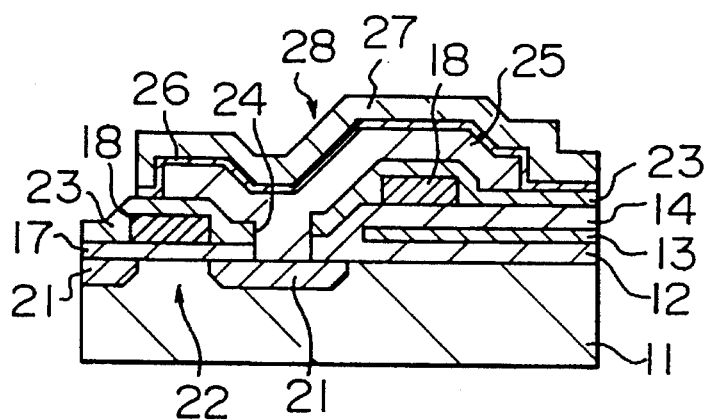
FIG. ID
PRIOR ART

SEMICONDUCTOR MEMORY DEVICE HAVING MEMORY CELLS WITH ENHANCED CAPACITOR CAPACITY

BACKGROUND OF THE INVENTION

1. Field of the Invention

The present invention relates to a semiconductor memory device namely a stacked capacitor type dynamic random access memory (DRAM) having a field shield separation structure and to a method of manufacturing the same.

2. Description of the Related Art

FIGS. 1A to 1D illustrate a method of manufacturing a conventional stacked capacitor type DRAM having the field shield separation structure. In the method, as shown in FIG. 1A, a silicon oxide layer 12, a conductive thin film layer 13 and an insulating layer 14 are successively formed on the whole surface of a silicon substrate 11.

Thereafter, portions of the insulating layer 14, the conductive thin film layer 13 and the silicon oxide layer 12 in an element forming area 15 are removed and only portions thereof in a field area 16 are left. In the process described up to now, a field shield separation structure having the conductive thin film layer 13 as a shield electrode can be formed.

Then, as shown in FIG. 1B, a gate insulating layer 17 is formed on the surface of the element forming area 15 and a gate electrode 18 is patterned on the gate insulating layer 17 and on the insulating layer 14. Then, a source and drain 21 are formed on both sides of the gate electrode 18 in the element forming area 15 to complete a transistor 22 of a memory cell. Thereafter, as shown in FIG. 1C, an insulating layer 23 is deposited on the whole surface and an opening 24 is formed in the insulating layer 23 and the gate insulating layer 17 to reach one of the source and drain 21.

Then, as shown in FIG. 1D, a lower electrode 25 of a capacitor is patterned to come into contact with one of the source and drain 21 through the opening 24, and a capacitor dielectric layer 26 and an upper electrode 27 are further formed to complete the capacitor 28 of the memory cell. A fixed voltage is applied to the conductive thin film layer 13 constituting the shield electrode to suppress conduction of a parasitic metal-oxide-semiconductor (MOS) transistor in the field area 16.

In the conventional device manufactured above, as apparent from FIG. 1D, the insulating layers 14 and 23 having a total thickness of 200 to 400 nm are interposed between the conductive thin film layer 13 serving as the shield electrode and the lower electrode 25 of the capacitor 28. Accordingly, a capacitance of the capacitor 28 produced by a potential difference between the conductive thin film layer 13 and the lower electrode 25 is of an almost negligible value.

Consequently, a capacitance of the capacitor 28 is restricted by a sum of areas of the upper surface and the side of the lower electrode 25, that is, a sum of areas of the lower electrode 25 and the upper electrode 27 opposite to each other through the capacitor dielectric layer 26. Accordingly, it is necessary to increase the area of the memory cell in order to increase its capacitance and hence it is difficult to attain the high level of integration.

SUMMARY OF THE INVENTION

Accordingly, it is an object of the present invention to provide a semiconductor memory device capable of attaining the high level of integration and to a method of manufacturing the same.

In order to solve the above problem, in the semiconductor memory device according to the present invention includes a transistor and a capacitor constituting a memory cell and a shield electrode in a field area by which device separation is attained, part of the lower electrode of the capacitor is opposite to part of the shield electrode through a dielectric layer and the dielectric layer constitutes a capacitor dielectric layer of the capacitor.

Further, it is desirable that the upper electrode of the capacitor and the shield electrode have the same electrical potential.

In addition, the present invention manufacturing method for the semiconductor memory device including a transistor and a capacitor constituting a memory cell and having a shield electrode in a field area by which device separation is attained, comprises the steps of forming a dielectric layer on the shield electrode, simultaneously forming in an insulating layer covering the transistor and in the dielectric layer a first opening reaching one of a source and drain of the transistor and a second opening for exposing part of the dielectric layer, and forming a lower electrode of the capacitor to come into contact with one of the source and drain and the dielectric layer through the first and second openings.

Further, it is desirable that the method further comprises a step of electrically connecting the upper electrode of the capacitor and the shield electrode.

In the semiconductor memory device according to the present invention, since electric charges of a signal can not only be stored in a surface opposite to the upper electrode through the capacitor dielectric layer but also in a surface opposite to the shield electrode through the dielectric layer, of the lower electrode of the capacitor constituting the memory cell, the capacitance of the memory cell is large as compared with a plane area of the memory cell.

In the manufacturing method of the semiconductor memory device according to the present invention, since the first and second openings for bringing the lower electrode of the capacitor into contact with one of the source and drain of the transistor and with the dielectric layer on the shield electrode are formed simultaneously, the semiconductor memory device according to the present invention can be manufactured only by addition of the step of forming the dielectric layer on the shield electrode as compared with the conventional method.

BRIEF DESCRIPTION OF THE DRAWINGS

FIGS. 1A to 1D are partially sectional views illustrating a conventional semiconductor memory device according to a conventional manufacturing method in order of processes.

DESCRIPTION OF THE PREFERRED EMBODIMENT

Figure 2A:
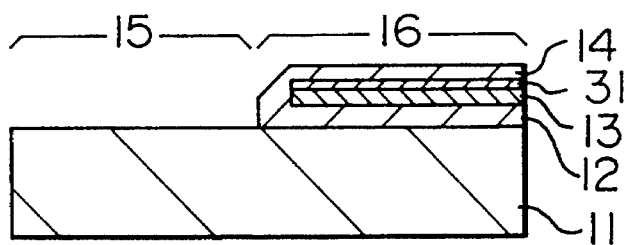
FIGS. 2A to 2E are partially sectional views illustrating a semiconductor memory device of the present invention according to a manufacturing method of the present invention in order of processes.

Referring now to FIGS. 2A to 2E, an embodiment in which the present invention is applied to a stacked capacitor type DRAM is described. In FIGS. 2A to 2E, elements corresponding to those shown in FIGS. 1A to 1D are designated by the same reference numerals.

In the embodiment, as shown in FIG. 2A, the silicon oxide layer 12, the thin conductive film layer 13, a dielectric layer 31 and the insulating layer 14 are successively formed on the whole surface of the silicon substrate 11. The thin conductive film layer 13 uses a polycrystalline silicon layer having a thickness of about 100 to 200 nm or a polyside layer. Further, as described later, since the dielectric layer 31 also functions as the capacitor dielectric layer, it uses a silicon nitride layer which has a thickness of about 5 to 10 nm and is deposited by the chemical vapor deposition (CVD) so as to enable an increase in capacitance of the capacitor.

Thereafter, portions of the insulating layer 14, the dielectric layer 31, the conductive thin film layer 13 and the silicon oxide layer 12 in the element forming area 15 are removed by the photolithography and etching process to leave only portions thereof in the field area 16. In the process described up to now, the field shield separation structure having the thin conductive film layer 13 as the shield electrode can be formed.

Figure 2B:
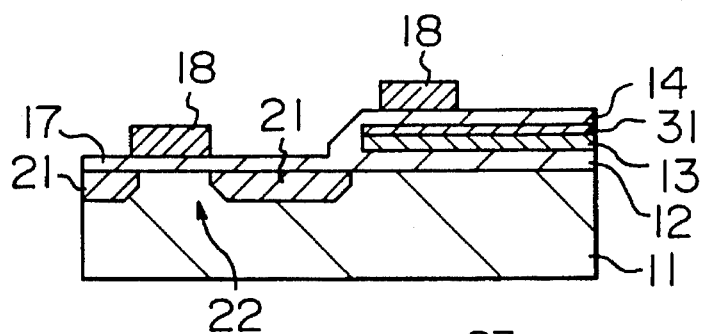

Then, as shown in FIG. 2B, the gate insulating layer 17 is formed on the surface of the element forming area 15 and the gate electrode 18 is patterned on the gate insulating layer 17 and on the insulating layer 14. The source and drain 21 are formed on both sides of the gate electrode 18 in the element forming area 15 to complete the transistor 22 of the memory cell.

Figure 2C:
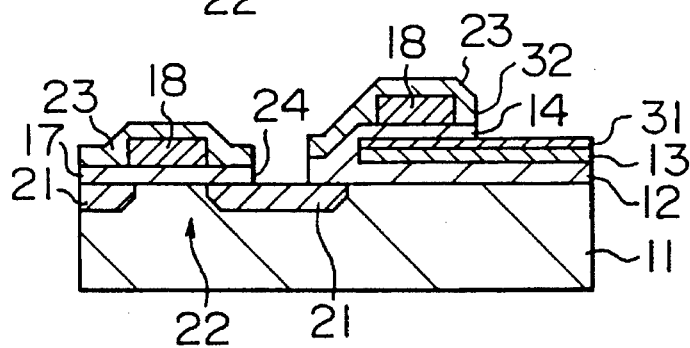

Subsequently, as shown in FIG. 2C, the insulating layer 23 is deposited on the whole surface and the opening 24 reaching one of the source and drain 21 and an opening 32 through which part of the dielectric layer 31 is exposed in an area separated from the gate electrode 18 by a predetermined distance are simultaneously formed in the insulating layers 23, 14 and the gate insulating layer 17 by the photolithography and etching process.

Figure 2D:
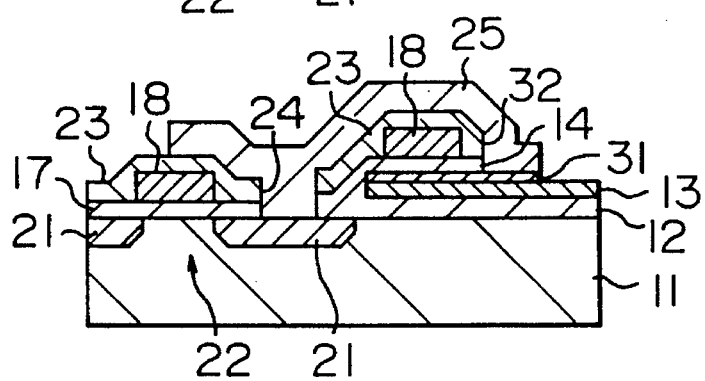

Then, as shown in FIG. 2D, the lower electrode 25 of the capacitor 28 is patterned to come into contact with one of the source and drain 21 and the dielectric layer 31 through the openings 24 and 32. The lower electrode 25 uses a polycrystalline silicon layer having a thickness of about 100 to 200 nm which is made by being deposited by the CVD and then heavily doped with phosphorus. Further, since the thickness of the dielectric layer 31 is thin, the dielectric layer 31 is patterned simultaneously with upon overetching for patterning the lower electrode 25.

Figure 2E:
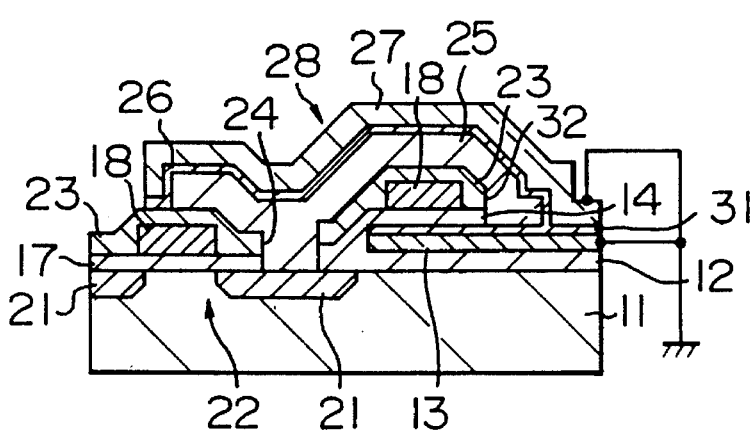

Next, as shown in FIG. 2E, the capacitance dielectric layer 26 and the upper electrode 27 are successively deposited by the CVD and the upper electrode 27 is patterned to complete the capacitor 28 of the memory cell. The capacitor dielectric layer 26 uses a silicon nitride layer having a thickness of about 5 to 10 nm in the same manner as the dielectric layer 31. Further, since the thickness of the capacitor dielectric layer 26 is thin, the capacitor dielectric layer 26 is also patterned simultaneously with upon overetching for patterning the upper electrode 27.

Thereafter, the upper electrode 27 is electrically connected to the conductive thin film layer 13 and in use of the embodiment the upper electrode 27 and the conductive thin film layer 13 are connected to ground. Thus, electric charges of a signal are stored in the surface of the lower electrode 25 opposite to the conductive thin film layer 13 through the dielectric layer 31 and the dielectric layer 31 also functions as the capacitor dielectric layer of the capacitor 28. Accordingly, the area of the dielectric layer 31 covered by the lower electrode 25 is made as large as possible. On the other hand, the conductive thin film layer 13 constituting the shield electrode suppresses conduction of a parasitic MOS transistor in the field area 16.

According to the semiconductor memory device of the present invention, since the capacitance of the memory cell is large as compared with a plane area of the memory cell, the high density of the memory cell can be attained.

According to the manufacturing method of the semiconductor memory device of the present invention, since the semiconductor memory device of the present invention can be manufactured only by addition of the step of forming the dielectric layer on the shield electrode as compared with the conventional method, the semiconductor memory device capable of attaining the high density can be easily manufactured.

We claim:

1. A semiconductor memory device including a memory cell having a transistor and a capacitor with a lower electrode and an upper electrode and a field area having a shield electrode for effecting element separation, comprising:

a dielectric layer formed on said shield electrode and having an upper surface which is in contact with said lower electrode of said capacitor;

wherein a part of said lower electrode of said capacitor is opposite to a part of said shield electrode through said dielectric layer, and wherein said dielectric layer functions as a capacitor dielectric layer of said capacitor.

2. The semiconductor memory device according to claim 1, wherein said upper electrode of said capacitor and the shield electrode have the same electrical potential.

3. A semiconductor memory device including a substrate and memory cells provided thereon, each memory cell having a transistor and a capacitor with a lower electrode, an upper electrode and a dielectric layer between said lower electrode and said upper electrode, the device comprising a field area having at least a shield electrode electrically connected with said substrate for electrically separating each of said memory cells from other memory cells, wherein said dielectric layer is extended to an upper surface of said shield electrode, and wherein said lower electrode is opposite to a part of said shield electrode through said dielectric layer, and said shield electrode is electrically connected to said upper electrode.

* * * * *